United States Patent [19]

Duperray et al.

[11] Patent Number: 5,594,932
[45] Date of Patent: Jan. 14, 1997

[54] METHOD OF MANUFACTURING AN ENCASED WIRE OF HIGH CRITICAL TEMPERATURE SUPERCONDUCTING MATERIAL

[75] Inventors: Gérard Duperray, La Norville; Denis Legat, Lisses, both of France

[73] Assignee: Alcatel Alsthom Compagnie General d'Electricite, Paris, France

[21] Appl. No.: 257,304

[22] Filed: Jun. 9, 1994

[30] Foreign Application Priority Data

Jun. 10, 1993 [FR] France .................................. 93 06993

[51] Int. Cl.$^6$ ................. B22F 3/16; C21D 1/00
[52] U.S. Cl. ..................... 419/29; 419/5; 419/22; 419/24; 419/28; 419/30; 419/45; 419/56
[58] Field of Search ...................... 419/5, 22, 24, 419/28, 29, 30, 45, 56; 505/430, 431, 433, 450, 490, 491

[56] References Cited

U.S. PATENT DOCUMENTS

| | | | |
|---|---|---|---|
| 5,087,604 | 2/1992 | Shiga et al. ................................ | 505/1 |
| 5,100,867 | 3/1992 | Gunzelman et al. ........................ | 505/1 |
| 5,283,232 | 2/1994 | Kohno et al. ............................... | 505/1 |
| 5,330,969 | 7/1994 | Finnemore et al. ..................... | 505/431 |
| 5,369,089 | 11/1994 | Sato et al. ............................... | 505/433 |
| 5,395,821 | 3/1995 | Kroeger et al. .......................... | 505/431 |

FOREIGN PATENT DOCUMENTS

| | | |
|---|---|---|
| 0404966A1 | 1/1990 | European Pat. Off. . |
| 0457929A1 | 11/1991 | European Pat. Off. . |
| WO8906053 | 6/1989 | WIPO . |

*Primary Examiner*—Donald P. Walsh
*Assistant Examiner*—John N. Greaves
*Attorney, Agent, or Firm*—Sughrue, Mion, Zinn, Macpeak & Seas

[57] ABSTRACT

In a method for the manufacture of an encased high critical temperature superconducting wire by the "powder in tube" method, prior to the introduction of a compressed rod of superconducting material into a silver tube, the rod is heat treated so that grains of unwanted phase are reabsorbed. The tube can be drawn more easily, and strands can be produced with a regular geometry and no defects. The wire is constituted by 15 μm to 20 μm thick filaments (30) with a form factor of more than 60.

5 Claims, 3 Drawing Sheets

METHOD OF MANUFACTURING AN ENCASED WIRE OF HIGH CRITICAL TEMPERATURE SUPERCONDUCTING MATERIAL

The present invention concerns a method of manufacturing an encased wire of high critical temperature superconducting material, and in particular the "powder in tube" method as described in French patent FR-A-2 675 620.

Very broadly, in a "Stage 0" first step of that method, a superconducting powder is introduced into a silver tube which is then sealed under vacuum. The following operations are then carried out:

drawing the tube through a wire-draw die to produce a single strand;

forming a billet by providing a second silver tube with sections of the single strand and sealing the second tube under vacuum;

drawing and/or rolling to the desired dimensions of the wire; and carrying out final heat treatment.

Using that method, experimenters rapidly established that increasing the form factor of the superconducting wire core appreciably increases its critical transport current. That geometry, which is obtained by pressing or rolling, appreciably increases the interface between the silver of the tube and the superconducting material, suggesting that the interface plays a beneficial role in the texturing process for lamellar superconducting compounds.

When teams have attempted to produce multifilament strands for industrial alternating current applications, they have made great efforts to retain a high form factor in these new structures. Three variants have been developed:

Variant a): Round stage 0, round or hexagonal monofilaments.

Variant b): Round stage 0, rectangular monofilaments.

Variant c): Rectangular stage 0, rectangular monofilaments.

Variant a) is described in European patent application EP-A-504 895 and in J. App. Phys 1991 70(3) p 1596–99. That variant comprises the following stages:

Filling a silver tube with superconducting powder;

Sealing the tube under vacuum;

Drawing through a wire-draw die to a round or hexagonal strand cross section;

Producing a billet by providing a second silver tube;

Drawing in identical fashion to the previous drawing stage;

Flattening the multifilament strand by rolling.

During this final stage, the multifilament strand takes on a ribbon shape and the superconducting filaments acquire a very flat elliptical cross section; however, the overall geometry is very disordered due to crossing over of the filaments which can cause breaks in continuity.

Variant b) is described in U.S. Pat. No. 5,114,908 and in "Cryogenics" 1992 52(11) p 940–947.

The first five stages are identical to those of variant a), then the round single strand is either rolled or drawn through a rectangular wire-draw die. Manufacture is continued as follows:

Producing a billet by coiling the rectangular section strands around a cylindrical silver core, introducing this into a tube and sealing under vacuum;

Drawing through a circular wire-draw die.

With that method, the ratio of the useful cross section of the wire to its total cross section is less than 10% because of the large cross section of the silver core.

Variant c) is described in French patent FR-A-2 675 620.

Stage 0 of that variant is distinct from that of variants a) and b) because it is rectangular.

The billet is produced by stacking rectangular single strands into a square section tube; after sealing under vacuum, that billet is drawn through a roll die to produce a ribbon which is less than 2 mm thick, which is then rolled to 0.5 mm or 0.3 mm. In its final state, the filaments are less than 20 microns thick and have a form factor of more than 60.

In the three variants a), b) and c), the superconducting material is generally introduced as a powder into the silver tube. However, "App. Superconductivity" 1993-1-(10-12) p 1515–22 indicates that a cylindrical rod obtained by aggregating the powder by isostatic compression could be introduced into the tube.

It has been shown that the production of wires with a large form factor using known methods presents specific problems.

Firstly, it is difficult to maintain geometric stability during the drawing operations.

The ability of the ceramic to flow depends on its grain size (individual grains and aggregate size) and on its crystalline state (grain morphology). Further, these parameters change during transformation.

In addition, the annealed silver is far more ductile than the aggregated powder, but the silver gradually work hardens, resulting in deformation due to differences in the flow characteristics of the two materials at any given moment. Thus a fine grain size (<30 microns) causes necking, resulting in repeated breaking.

In order to alleviate those problems, low reduction factors must be used, less than 10% of cross section between two passes. Frequent annealing is necessary, each time the cross section is reduced by 40%.

Unfortunately, annealing the silver changes the ratio of the cross section of the superconducting material to the total cross section, due to the differential flow of silver and of superconductor; the silver is forced to the ends of the wire. This phenomenon must therefore be taken into account when selecting the initial form ratio (for example 40% at outset to produce 30% in the final wire). Such selection is difficult because the changes during the course of the method are variable, depending on the type of powder and the sequence of operations.

The problems described above complicate manufacture and involve extra expense, but do not compromise the quality of the final product. This is not the case with the large hard grains present in the powder, usually unwanted phases in the superconducting phase which deform the silver casing creating blisters in the filaments and even perforating the external silver casing, causing liquid or volatile compounds to leak during heat treatment.

The object of the present invention is to improve the "powder in tube" method to avoid the problems due to unwanted phases in the superconducting material, and to improve the behavior of the wire during all the drawing stages.

The present invention provides a method of manufacturing an encased high critical temperature superconducting wire, a "powder in tube" method, comprising the following operations:

filling a first silver tube with a rod of compressed high critical temperature superconducting powder and sealing the first tube under vacuum;

drawing said tube through a wire-draw die to produce a single strand;

forming a billet by providing a second silver tube with sections of said single strand and sealing said second tube under vacuum;

drawing and/or rolling the billet to the dimensions desired for said wire; and carrying out final heat treatment;

the method being characterized in that, prior to being introduced into said first silver tube, said rod of compressed powder is heat treated in the following stages:

a period at a high temperature $T_1$ in an oxygen atmosphere to recrystallize the superconducting phase of said powder in the presence of traces of liquids and to eliminate the unwanted phases as much as possible;

a slow descent at 1° C. to 5° C. per hour to a temperature $T_2$ to avoid precipitating microcrystals of said unwanted phases at the grain boundaries;

a rapid descent to a temperature $T_3$; and a period at said temperature $T_3$ during which the concentration of carriers in said superconducting material is increased.

If said powder is of the type:

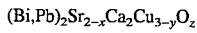

$T_1$ lies in the range 790° C. to 840° C., for a period that lies in the range 45 hours to 100 hours;

$T_2$ is equal to $T_1$–20° C. and the rate of descent from $T_1$ to $T_2$ lies in the range 2° C. to 5° C. per hour;

$T_3$ lies in the range 400° C. to 600° C. and the rate of descent from $T_2$ to $T_3$ lies in the range 120° C. to 300° C. per hour; and the duration of the period at $T_3$ lies in the range 10 hours to 20 hours in pure oxygen.

The duration of the period at temperature $T_1$ depends on the degree of synthesis of the powder employed. It would be 45 hours to 60 hours for a 90% pure product and of the order of 100 hours for a commercially available product where the superconducting phase content is normally less than 80%.

When said powder is stoichiometric, i.e. with formula:

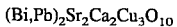

$T_1$ is 815° C., for 60 hours;

$T_2$ is 795° C. and the rate of descent from $T_1$ to $T_2$ is 3° C. per hour;

$T_3$ is 450° C. and the rate of descent from $T_2$ to $T_3$ equals 200° C. per hour; and the duration of the period at $T_3$ is 20 hours in pure oxygen.

When said powder is of the type:

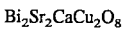

the method comprises an additional stage wherein, prior to the period at temperature $T_1$, the temperature is raised to at least 870° C. to fuse said powder completely; in addition:

$T_1$ lies in the range 830° C. to 870° C., for a period lying in the range 20 hours to 50 hours;

$T_2$ is equal to $T_1$–20° C. and the rate of descent from $T_1$ to $T_2$ lies in the range 2° C. to 5° C. per hour;

$T_3$ lies in the range 600° C. to 700° C. and the rate of descent from $T_2$ to $T_3$ lies in the range 120° C. to 300° C. per hour; and the duration of the period at $T_3$ lies in the range 20 hours to 40 hours in pure nitrogen.

Finally, when said powder is of the type:

$T_1$ lies in the range 930° C. to 960° C., for a period lying in the range 0.5 hours to 5 hours;

$T_2$ is equal to $T_1$–30° C. and the rate of descent from $T_1$ to $T_2$ lies in the range 1° C. to 3° C. per hour;

$T_3$ lies in the range 400° C. to 500° C. and the rate of descent from $T_2$ to $T_3$ lies in the range 120° C. to 300° C. per hour; and the duration of the period at $T_3$ lies in the range 10 hours to 20 hours.

In all these embodiments, the features of the invention quite unexpectedly causes fractioning of the unwanted phase grains in said powder into smaller grains, and can completely reabsorb them.

These features also improve the behavior of the wire during drawing, which means that the number of annealing stages can be greatly reduced: only one is needed, instead of ten as previously required.

It would appear that the ceramic, having recrystallized as lamellae, attains a flow behavior which is similar to the ductility of the silver. The flow is more regular and the strain is lower; there are no more "jams" or sites where necking occurs; the silver work-hardens less and the flow of the two materials is coordinated, maintaining the ratio of the superconductor cross section to the total cross section constant throughout the course of the mechanical operations.

Further features and advantages of the present invention will become clear from the following description of illustrative but non limiting embodiments. In the accompanying drawings.

EXAMPLE 1—Prior art 10 mm diameter cylinders were produced by isostatic compression of Bi2223 powder: $(Bi,Pb)_2Sr_2Ca_2Cu_3O_{10}$.

These cylinders were introduced into a silver tube with an inside diameter of 10 mm and outside diameter of 12 mm; the tube was then sealed under vacuum.

This billet was drawn through a circular wire-draw die to a diameter of 5 mm, then in a roll die to produce a ribbon with a cross sectional area of 3×0.75 mm². In each case a reduction coefficient of 10% of cross section (5% of diameter) was applied for each pass.

The silver casing was annealed for 24 hours at 350° C. each time the cross section was reduced by 40%.

Figure 1:
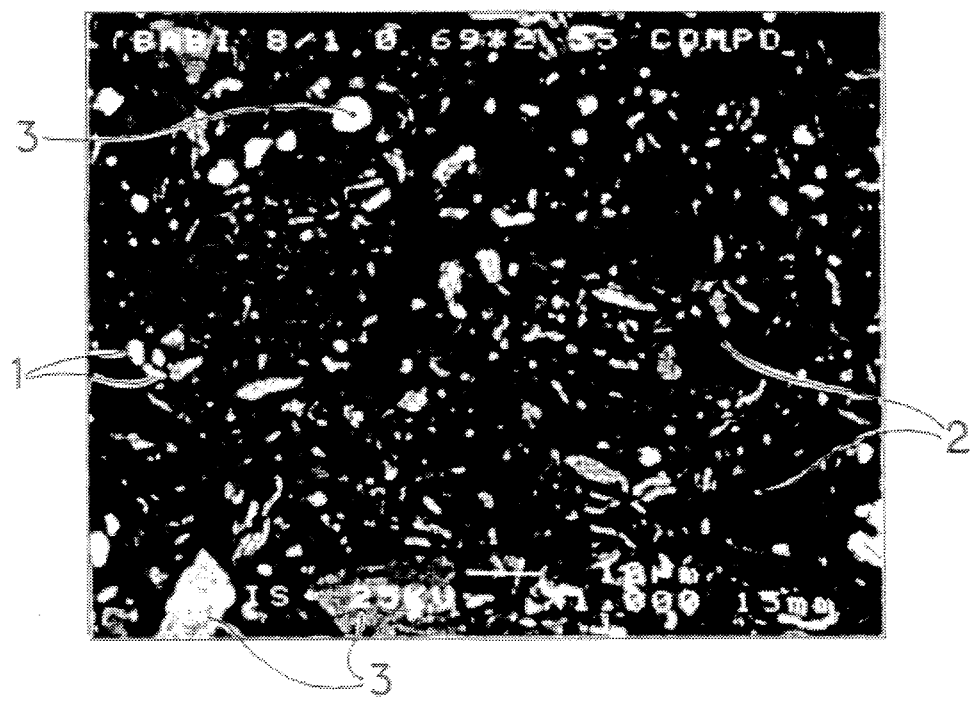
FIG. 1 shows a section through a single strand obtained using a prior art method.

FIG. 1 shows a section through the single strand obtained. The structure is heterogeneous. Gray grains 1 of Bi2223 phase are rounded and black and white grains 3, 2 of the unwanted phases are large and unevenly distributed.

The single strand was cut into sections which were inserted in bundles of fifteen sections into a tube of square cross section with an internal side of 10 mm and an external side of 12 mm; the tube was sealed under vacuum.

The billet thus formed was drawn through a roll die. The ribbon was brought to its final size of 3×0.5 mm² and heat treated for 60 hours at 815° C. in an oxygen atmosphere.

Figure 2:
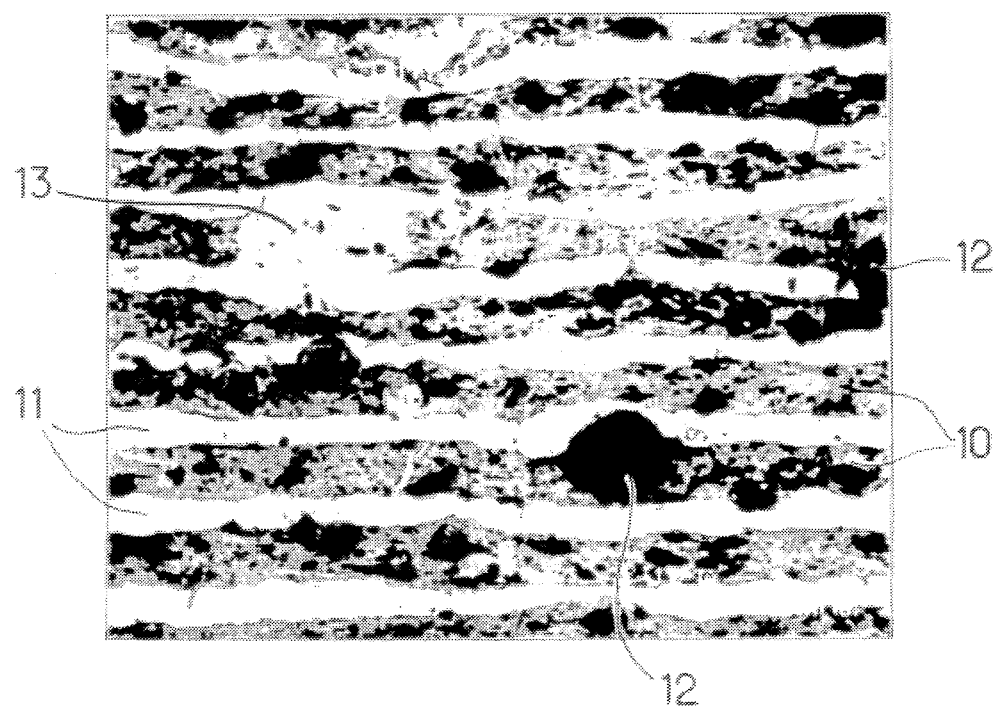
FIG. 2 shows a section through a multifilament strand of the prior art produced from the single strand of FIG. 1.

The final strand had a regular geometry constituted by filaments that are 15 microns to 20 microns thick with a form factor of more than 60, however a deterioration in the geometry can be seen due to hard nodules of unwanted phases in the superconducting material which have deformed the silver walls. FIG. 2, then, shows a section across filaments 10 and their silver casing 11, and hard nodules 12 ($Ca_2CuO_3$) and 13 ($Ca_2PbO_4$).

Figure 3:
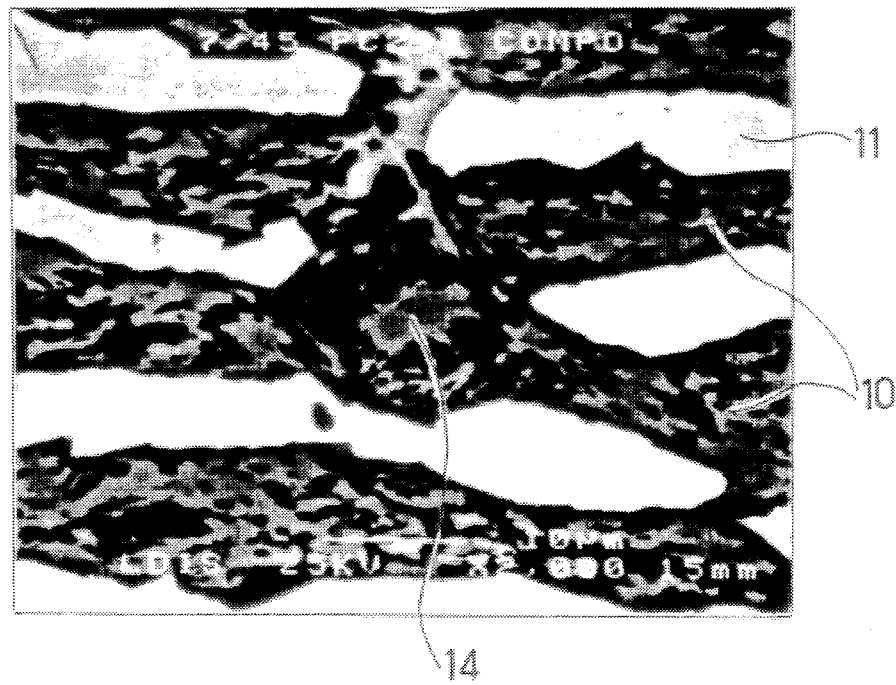
FIG. 3 shows a larger scale section through the multifilament strand of FIG. 2 following the final heat treatment.

FIG. 3 shows the site 14 of an old nodule 12 or 13 which has been retransformed into Bi2223 superconducting phase during the final heat treatment of the wire; a cavity remains at site 14 of old nodule 12 or 13.

EXAMPLE 2

10 mm diameter cylinders of stoichiometric Bi2223 powder were produced by isostatic compression as in Example 1.

In accordance with the invention, these cylinders were heat treated for 60 hours at $T_1=815°$ C. The temperature was then reduced by 3° C. per hour to $T_2=795°$ C., then by 200° C. per hour to $T_3=450°$ C. The duration of the period at $T_3$ was 20 hours in pure oxygen.

The rods did not shrink following this heat treatment. They were then introduced into a silver tube with an inside diameter of 10 mm and outside diameter of 12 mm; the tube was sealed under vacuum.

This billet was drawn through a circular wire-draw die to a diameter of 5 mm, then in a roll die to produce a ribbon with a cross sectional area of 2.4×0.75 mm². In each case a reduction coefficient of 15% in cross section (8% in diameter) was applied for each pass. The silver casing was annealed just once for 24 hours at 350° C.

Figure 4:
FIG. 4 shows a section through a single strand produced using the method of the invention.

The single strand obtained can be seen in section in FIG. 4. Comparing with FIG. 1, it can be seen that the unwanted phase grains 5 are smaller or have cleaved and are better distributed in a homogeneous structure 6 of Bi2223 phase which has recrystallized as lamellae.

The single strand was cut into sections which were inserted in four bundles of thirteen sections into a square cross section tube with an internal side of 10 mm and an external side of 12 mm; the tube was sealed under vacuum.

Figure 5:
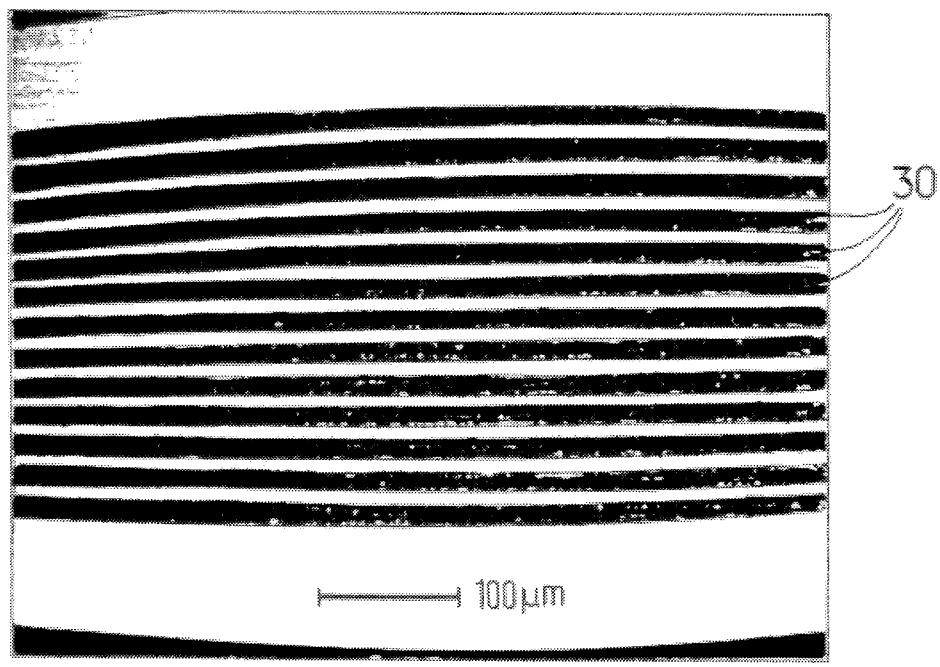
FIG. 5 shows a section through a wire in accordance with the invention.

The billet thus formed was drawn through a roll die and the ribbon brought to its final cross sectional area of 3×0.5 mm² then heat treated once again as in Example 1. The multifilament strand thus obtained can be seen in section in FIG. 5; it has regular geometry which is without defects and is constituted by filaments that are 15 microns to 20 microns thick with a form factor of more than 60.

EXAMPLE 3

This was identical to Example 2 in accordance with the invention, except that the powder used was a non stoichiometric powder with formula

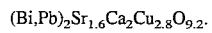
$(Bi,Pb)_2Sr_{1.6}Ca_2Cu_{2.8}O_{9.2}$.

The heat treatment parameters of the initial powder rod were as follows:
  $T_1=800°$ C. for 100 hours;
  $T_2=700°$ C. with a rate of descent from $T_1$ to $T_2$ of 3° C. per hour;
  $T_3=450°$ C. with a rate of descent from $T_2$ to $T_3$ of 200° C. per hour;
  Duration of period at $T_3$ was 20 hours in pure oxygen.

The improvements to the method of manufacture of the multifilament strand and the quality of the geometry were identical to those obtained with Example 2.

EXAMPLE 4

This was identical to Example 2 in accordance with the invention except that the powder used had formula

$Bi_2Sr_2CaCu_2O_8$ and the temperature was initially raised to 870° C. The other stages were as follows:
  $T_1=850°$ C. for 50 hours;
  $T_2=820°$ C. with a rate of descent from $T_1$ to $T_2$ of 3° C. per hour;
  $T_3=650°$ C. with a rate of descent from $T_2$ to $T_3$ of 200° C. per hour;
  Duration of period at $T_3$ of 40 hours.

The same improvements as those for Examples 2 and 3 were observed.

EXAMPLE 5

7 mm cylinders were produced by isostatic compression of $YBa_2Cu_3O_7$ powder.

These cylinders were heat treated in accordance with the invention:
  1 hour at $T_1=940°$ C. in an oxygen atmosphere.

The temperature was reduced to $T_2=910°$ C. at 2° C. per hour, then to $T_3=450°$ C. at 120° C. per hour. The duration of the period at $T_3$ was 20 hours in pure oxygen.

The diameter of the rods was reduced to 6 mm on shrinking. They were then introduced into a silver tube with an inside diameter of 6 mm and an outside diameter of 8 mm; the tube was sealed under vacuum.

The billet was drawn through a circular wire-draw die to a diameter of 3 mm, then in a roll die to produce a ribbon with a cross sectional area of 2.4×0.75 mm². In each case, a reduction coefficient of 10% in cross section (5% in diameter) was applied for each pass. The silver casing was annealed only once for 24 hours at 350° C. before drawing through the roll die.

The wire obtained was cut into sections which were inserted in four bundles of thirteen sections into a tube of square cross section with an internal side of 10 mm and an external side of 12 mm; the tube was sealed under vacuum.

The billet thus produced was drawn through a roll die to its final cross sectional area of 3×0.5 mm² and heat treated once more.

The final strand had regular geometry constituted by filaments that are 15 microns to 20 microns thick and a form factor of more than 60.

The invention is not limited to the examples of superconducting materials mentioned above. In each case, the method of the invention greatly improves reproducibility, increases the simplicity of operation and reduces costs.

We claim:

1. A method for the manufacture of an encased high critical temperature superconducting wire, a "powder in tube" method, comprising the following operations:
  filling a first silver tube with a rod of compressed high critical temperature superconducting powder and sealing the first tube under vacuum;
  drawing said tube through a wire-draw die to produce a single strand;
  forming a billet by providing a second silver tube with sections of said single strand and sealing said second tube under vacuum;

drawing and/or rolling the billet to the dimensions desired for said wire; and carrying out final heat treatment;

the method being characterized in that, prior to being introduced into said first silver tube, said rod of compressed powder is heat treated in the following stages:

a period at a high temperature $T_1$ in an oxygen atmosphere to recrystallize the superconducting phase of said powder in the presence of traces of liquids and to eliminate the unwanted phases as much as possible;

a slow descent at 1° C. to 5° C. per hour to a temperature $T_2$ to avoid precipitating microcrystals of said unwanted phases at the grain boundaries;

a rapid descent to a temperature $T_3$; and a period at said temperature $T_3$ during which the concentration of carriers in said superconducting material is increased.

2. A method according to claim 1, wherein said powder has formula:

$$(Bi,Pb)_2Sr_{2-x}Ca_2Cu_{3-y}O_z$$

$T_1$ lies in the range 790° C. to 840° C., for a period that lies in the range 45 hours to 100 hours;

$T_2$ is equal to $T_1-20°$ C. and the rate of descent from $T_1$ to $T_2$ lies in the range 2° C. to 5° C. per hour;

$T_3$ lies in the range 400° C. to 600° C. and the rate of descent from $T_2$ to $T_3$ lies in the range 120° C. to 300° C. per hour; and the duration of the period at $T_3$ lies in the range 10 hours to 20 hours under pure oxygen.

3. A method according to claim 2, wherein said powder is stoichiometric with formula:

$$Bi_2Sr_2Ca_2Cu_3O_{10}$$

$T_1$ is 815° C., for 60 hours;

$T_2$ is 795° C. and the rate of descent from $T_1$ to $T_2$ is 3° C. per hour;

$T_3$ is 450° C. and the rate of descent from $T_2$ to $T_3$ equals 200° C. per hour; and the duration of the period at $T_3$ is 20 hours in pure oxygen.

4. A method according to claim 1, wherein said powder has formula:

$$Bi_2Sr_2CaCu_2O_8$$

characterized in that, prior to the period at temperature $T_1$, the temperature is raised to at least 870° C. to fuse said powder completely; and in that $T_1$ lies in the range 830° C. to 870° C., for a period lying in the range 20 hours to 50 hours;

$T_2$ is equal to $T_1-20°$ C. and the rate of descent from $T_1$ to $T_2$ lies in the range 2° C. to 5° C. per hour;

$T_3$ lies in the range 600° C. to 700° C. and the rate of descent from $T_2$ to $T_3$ lies in the range 120° C. to 300° C. per hour; and the duration of the period at $T_3$ lies in the range 20 hours to 40 hours in pure nitrogen.

5. A method according to claim 1, wherein said powder is of the type:

$$YBa_2Cu_3O_{7-z}$$

$T_1$ lies in the range 930° C. to 960° C., for a period lying in the range 0.5 hours to 5 hours;

$T_2$ is equal to $T_1-30°$ C. and the rate of descent from $T_1$ to $T_2$ lies in the range 1° C. to 3° C. per hour;

$T_3$ lies in the range 400° C. to 500° C. and the rate of descent from $T_2$ to $T_2$ lies in the range 120° C. to 300° C. per hour; and the duration of the period at $T_3$ lies in the range 10 hours to 20 hours.

* * * * *